(12) United States Patent
Cometti et al.

(10) Patent No.: US 11,190,218 B2
(45) Date of Patent: *Nov. 30, 2021

(54) CODE RATE SWITCHING MECHANISM FOR DATA STORAGE SYSTEM

(71) Applicant: Western Digital Technologies, Inc., San Jose, CA (US)

(72) Inventors: Aldo Giovanni Cometti, San Diego, CA (US); Aniryudh Reddy Durgam, San Diego, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 16/826,063

(22) Filed: Mar. 20, 2020

(65) Prior Publication Data

US 2020/0220561 A1 Jul. 9, 2020

Related U.S. Application Data

(63) Continuation of application No. 15/868,868, filed on Jan. 11, 2018, now Pat. No. 10,644,727.

(51) Int. Cl.
*H03M 13/35* (2006.01)
*G06F 3/06* (2006.01)
*G06F 11/10* (2006.01)
*G11C 29/52* (2006.01)
*G11C 29/04* (2006.01)

(52) U.S. Cl.
CPC .......... *H03M 13/35* (2013.01); *G06F 3/0616* (2013.01); *G06F 3/0634* (2013.01); *G06F 3/0652* (2013.01); *G06F 3/0659* (2013.01); *G06F 3/0679* (2013.01); *G06F 11/1068* (2013.01); *G11C 29/52* (2013.01); *G11C 2029/0409* (2013.01); *G11C 2029/0411* (2013.01)

(58) Field of Classification Search
None
See application file for complete search history.

(56) References Cited

U.S. PATENT DOCUMENTS 9,214,963 B1 12/2015 Garani
10,069,859 B2 9/2018 Andrews
(Continued)

FOREIGN PATENT DOCUMENTS

| KR | 20080013755 A | 2/2008 |
| KR | 20130025415 A | 3/2013 |
| KR | 20130060321 A | 6/2013 |

OTHER PUBLICATIONS

International Search Report and Written Opinion from PCT/US2019/012418, dated Apr. 26, 2019, 12 pages.

*Primary Examiner* — Phung M Chung
(74) *Attorney, Agent, or Firm* — Morgan, Lewis & Bockius LLP

(57) ABSTRACT

A data storage system capable of switching a code rate based on a host command is disclosed. A controller of the data storage system may set a code rate in a data storage device to a first code rate for encoding data to be written to non-volatile memory of the data storage device. The controller may receive, at the data storage device, a host command indicating a switch point for switching the set code rate from the first code rate to a second code rate. The controller may switch the set code rate from the first code rate to the second code rate at the indicated switch point.

20 Claims, 5 Drawing Sheets

(56) References Cited

U.S. PATENT DOCUMENTS

| | | |
|---|---|---|
| 10,644,727 B2 * | 5/2020 | Cometti ................ G06F 3/0679 |
| 2013/0031438 A1 | 1/2013 | Hu |
| 2013/0124945 A1 | 5/2013 | Hu |
| 2014/0136927 A1 | 5/2014 | Li et al. |
| 2014/0157089 A1 | 6/2014 | Dave et al. |
| 2014/0229799 A1 | 8/2014 | Hubris et al. |
| 2015/0234704 A1 | 8/2015 | Radke |
| 2017/0004031 A1 | 1/2017 | Dick |
| 2017/0262332 A1 | 9/2017 | Barndt et al. |

* cited by examiner

CODE RATE SWITCHING MECHANISM FOR DATA STORAGE SYSTEM

CROSS-REFERENCE TO RELATED APPLICATION

This application is a continuation of U.S. application Ser. No. 15/868,868, filed on Jan. 11, 2018, now U.S. Pat. No. 10,644,727, the entirety of which is incorporated herein by reference for all purposes.

BACKGROUND

Non-volatile flash memory has limited lifetime. The lifetime of the flash memory may correspond to a number of program-erase (P/E) cycles that the flash memory can endure. To protect user data stored in the flash memory from corruption, parity data may be generated and stored along with user data to facilitate error detection and/or correction. If a higher code rate is used to encode data, less parity data is generated and stored. Because less parity data is stored when the higher code rate is used, the higher code rate may allow more storage capacity of the flash memory. On the other hand, if a lower code rate is used, more parity data is generated to protect user data from errors and thus less storage capacity of the flash memory becomes available.

SUMMARY

A system and method of code rate switching for a data storage system is provided. According to some implementations, the method comprises setting a code rate in a data storage device to a first code rate for encoding data to be written to non-volatile memory of the data storage device, receiving, at the data storage device, a host command indicating a switch point for switching the set code rate from the first code rate to a second code rate, and switching the set code rate from the first code rate to the second code rate at the indicated switch point.

According to some implementations, a data storage device comprises a non-volatile memory and a controller coupled to the non-volatile memory. The controller is configured to: set a code rate in the data storage device to a first code rate for encoding data to be written to the non-volatile memory, receive, at the data storage device, a host command indicating a switch point for switching the set code rate from the first code rate to a second code rate, determine that the indicated switch point has been reached in the non-volatile memory, and switch the set code rate from the first code rate to the second code rate in response to determining that the indicated switch point has been reached.

According to some implementations, a non-transitory machine-readable medium comprises instructions thereon that, when executed, cause an encoding module to perform a method. In these implementations, the method comprises setting a code rate to a first code rate for encoding data to be written to non-volatile memory of a data storage device, receiving a host command indicating a switch point for switching the set code rate from the first code rate to a second code rate, switching the set code rate from the first code rate to the second code rate at the indicated switch point, reading and decoding data encoded at the first code rate from the non-volatile memory in response to switching the set code rate from the first code rate to the second code rate, encoding the read and decoded data at the second code rate, and writing the data encoded at the second code rate to the non-volatile memory.

According to some implementations, a data storage device comprises non-volatile memory, means for setting a code rate in the data storage device to a first code rate for encoding data to be written to the non-volatile memory, means for receiving, at the data storage device, a host command indicating a switch point for switching the set code rate from the first code rate to a second code rate, means for determining that the indicated switch point has been reached in the non-volatile memory, and means for switching the set code rate from the first code rate to the second code rate in response to determining that the indicated switch point has been reached.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

Systems and methods that embody the various features of the subject technology will be described with reference to the following drawings, in which.

DETAILED DESCRIPTION

Figure 1:
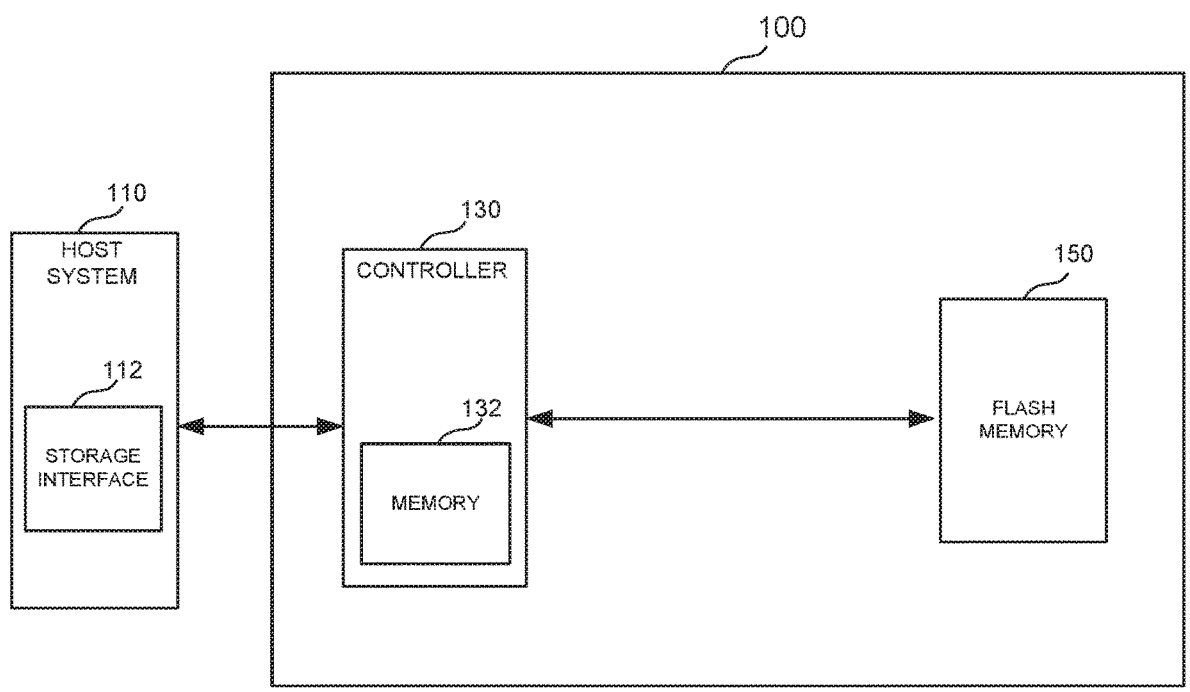
FIG. 1 illustrates an example non-volatile flash memory system according to aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Data storage systems, such as solid state drives, may include one or more controllers coupled with one or more non-volatile flash memory arrays. Stored data may be subject to errors as a result of, for example, read/write disturbs, loss of data retention, and/or deterioration in endurance. For example, the data retention may be the capability of the flash memory to retain stored information over time, and thus may correspond to a period of time that stored data can be reliably retrieved from the flash memory. Endurance may correspond to a number of program-erase (P/E) cycles that the flash memory can endure before an error rate exceeds a threshold or the data is unreadable. Data storage systems may utilize one or more error correction or error coding mechanisms to detect and/or correct errors in the stored data. For example, when writing user data, the user data may be encoded with parity data and stored in the flash memory arrays. When user data stored in the flash memory arrays is retrieved, parity data associated with the user data may be retrieved and utilized to determine the integrity of the retrieved user data. If one or more errors are detected in the retrieved user data, such errors may be corrected.

Generation of parity data may involve considerable system overhead, such as processing time overhead, system resources overhead, and/or system components overhead (e.g., necessity to use additional hardware, firmware, etc.). Furthermore, storing parity data (e.g., in a flash memory array) may reduce memory space available for storage of user data. Accordingly, it may be advantageous for a data storage system to support multiple different code rates, code lengths, and/or different coding throughput speeds. For example, a data storage system may encode data using a higher code rate, so that less parity data is generated and stored, when a flash memory is early in the lifecycle and thus provides sufficient data retention and/or endurance. As the flash memory wears out over time, the data storage system may automatically switch to a lower code rate such that more parity data is generated to protect user data from errors. Therefore, the data storage system may be preconfigured to automatically switch to a lower code rate when a predefined switch point in the lifecycle of the flash memory is reached. However, such code rate switching at the predefined switch point may not be desirable in certain situations, e.g., where the actual amount of errors is less than the expected amount of errors at a given point in the lifecycle of the flash memory.

In some cases, the flash memory may be taken offline (e.g., disconnected from a power source). For example, the flash memory may be unplugged and stored in a storage room. The time duration during which the flash memory is deactivated may be referred to as an offline duration. During the offline duration, due to charge leakage, integrity of data stored in the flash memory may deteriorate over time, thereby adversely affecting data retention. Thus, if a lengthy offline duration is expected, more error correction may be desired. For example, if a lengthy offline duration is expected, using more parity data may be desired to provide more error correction capability. Therefore, an expected offline duration may also affect an optimal switch point to switch to a lower code rate.

Example implementations of the subject technology are directed to a data storage system configured to adjust a code rate based on a host command from a host system. For example, a host command may be provided to a controller of the data storage system such that the controller may switch from one code rate to another code rate based on the host command. Accordingly, a switch point of the code rate may not be limited to a predefined switch point but may be indicated by a host command, providing flexibility in controlling the code rate switch based on the host command.

FIG. 1 illustrates an example non-volatile flash memory system 100 according to aspects of the subject technology. As shown, data storage system 100 (e.g., a solid-state drive) includes a controller 130 and a flash memory 150. The flash memory 150 may comprise non-volatile memory, such as flash integrated circuits, NAND flash memory (e.g., single-level cell (SLC) memory, multi-level cell (MLC) memory, or any combination thereof), NOR flash memory, EEPROM flash memory, other discrete flash NVM (non-volatile memory) chips, or any combination thereof. The data storage system 100 may further comprise other types of storage.

Controller 130 may be configured to receive data and/or storage access commands from a storage interface 112 (e.g., a device driver) of a host system 110. Storage access commands communicated by the storage interface 112 may include write data and read data commands issued by the host system 110. Read and write commands may specify a logical address (e.g., logical block addresses or LBAs) used to access the data storage system 100. Controller 130 may execute the received commands in the flash memory 150.

Data storage system 100 may store data communicated by the host system 110. In other words, the data storage system 100 may act as memory storage for the host system 110. To facilitate this function, controller 130 may implement a logical interface. The logical interface may present to the host system 110 the data storage system's memory as a set of logical addresses (e.g., contiguous address) where user data may be stored. Internally, controller 130 may map logical addresses to various physical locations or addresses in the flash memory 150 and/or other storage modules. Controller 130 includes, among other things, a memory 132. The memory 132 may include a volatile memory, such as dynamic random-access memory (DRAM), static random-access memory (SRAM), or any combination thereof. Controller 130 is configured to store data in and retrieve data from the flash memory 150, determine integrity of data retrieved from the non-volatile memory array, perform, if necessary, error correction of retrieved data, and perform transfer of data between the data storage system 100 and the host system 110.

As discussed above, because the flash memory 150 may wear out and thus may become more susceptible to errors over time, a lower code rate may be preferred later in the lifecycle of the flash memory 150 to provide more protection from errors. Therefore, the controller 130 may be configured to encode data using a first code rate when the flash memory 150 is early in the lifecycle, and may switch to a second code rate to encode data when the flash memory 150 is later in the lifecycle, where the second code rate may be lower than the first code rate. The lifecycle of the flash memory 150 may be represented by a number of P/E cycles. Therefore, in one aspect, the controller 130 may be configured to utilize the first code rate early in the lifecycle before the number of P/E cycles reaches a P/E cycle threshold, and to switch to the second code rate when the number of P/E cycles reaches the P/E cycle threshold. The P/E cycle threshold may indicate a switch point to switch from the first code rate to the second code rate.

An optimal switch point to switch from the higher code rate to the lower code rate may depend on whether the data storage system 100 is online (e.g., in a cycling mode) or is planned to be taken offline (e.g., in a retention mode) as well as an expected offline duration indicating a time duration during which the data storage system 100 goes offline. During the offline duration when the data storage system 100 is offline (e.g., in the retention mode), the flash memory 150 may experience charge leakage, which may deteriorate integrity of data stored in the non-volatile flash memory. Hence, an optimal switch point for a situation where the data storage system 100 goes offline for some duration may be earlier in the lifecycle than an optimal switch point for a situation where the data storage system 100 stays online.

Figure 2:
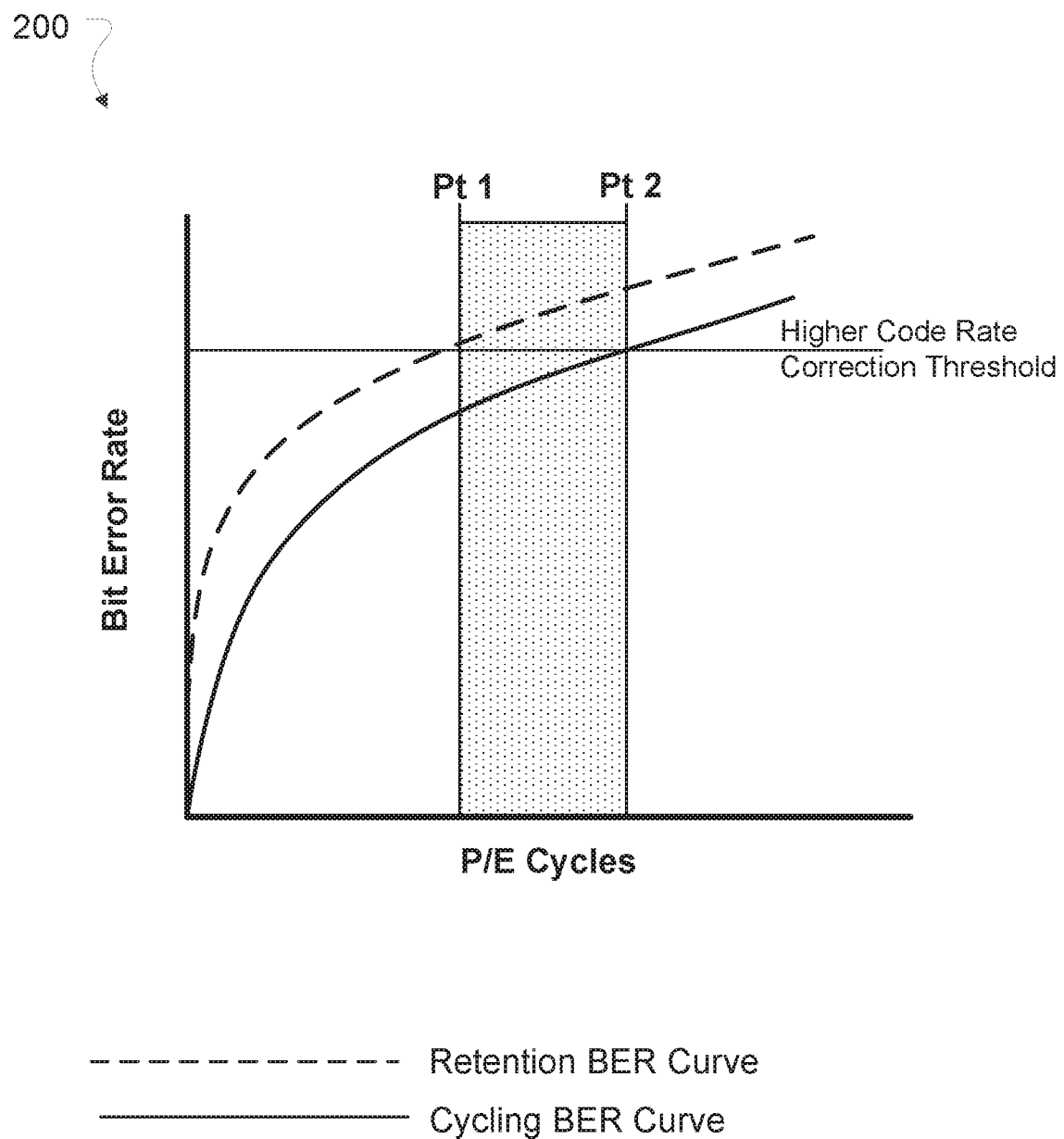
FIG. 2 depicts an exemplary graph illustrating switching points of a code rate for various situations.

FIG. 2 depicts an exemplary graph 200 illustrating switching points of a code rate for various situations. The x-axis represents a number of P/E cycles and the y-axis represents a bit error rate (BER). As the number of P/E cycles increases, the bit error rate increases. At a point where the bit error rate exceeds an error threshold, the code rate is switched from a first code rate to a second code rate, where the second code rate is lower than the first code rate. The solid curve represents the bit error rate in a cycling case where the storage device stays online without going offline. The dotted curve represents the bit error rate in a retention case where the storage device is planned to be taken offline for some offline duration (e.g., 3 months). The bit error rate in the retention case is likely to increase faster than that of the cycling mode as the number of P/E cycles increases (e.g., due to the charge leakage caused by going offline during the offline duration). Thus, the bit error rate in the retention case will reach the error threshold faster than that of the cycling case. Therefore, the code rate switch from the first code rate to the second code rate should occur earlier in the life cycle of the memory when the storage device is expected to go offline for some offline duration. In the graph 200, the switch point is at point 1 for the retention case, while the switch point is at point 2 for the cycling case. In the retention case, when the number of P/E cycles reaches point 1, the code rate is switched to the second code rate that is lower than the first code rate. In the cycling case, when the number of the P/E cycles reaches point 2, the code rate is switched to the second code rate that is lower than the first code rate.

To consider the possibility of the data storage system 100 going offline, the data storage system 100 may be preconfigured with a P/E cycle threshold for an optimal switch point for a situation where the data storage system 100 goes offline for a predefined offline duration (e.g., 3 months). However, if the data storage system 100 is not expected to go offline, the optimal switch point may later in the life cycle than the preconfigured switch point and thus may correspond to a number of P/E cycles greater than the preconfigured P/E cycle threshold. On the other hand, if the data storage system 100 is expected to go offline for a duration longer than the predefined offline duration, the optimal switch point may earlier in the life cycle than the preconfigured switch point and thus may correspond to a number of P/E cycles smaller than the preconfigured P/E cycle threshold. Therefore, with the preconfigured P/E cycle threshold, the controller 130 may not be able to perform the code rate switch at an optimal switch point to switch from the higher code rate to the lower rate, especially if the data storage system 100 goes offline for a duration shorter or longer than the predefined offline duration.

The subject technology enables the controller 130 to receive a host command that indicates a switch point, such that the controller 130 may switch the code rate at the switch point indicated by the host command. For example, if a user knows that the data storage system 100 will stay online indefinitely, the user may enter a host command that indicates a switch point that corresponds to a later point in the lifecycle than the preconfigured switch point. On the other hand, if the user knows that the data storage system 100 will be offline for an extended period of time (e.g., greater than the predefined offline duration), the user may enter a host command that indicates a switch point that corresponds to an earlier point in the lifecycle than the preconfigured switch point. Based on the host command, the controller 130 may perform the code rate switch at the switch point indicated by the host command. Thus, when the host command is received, the controller 130 may not utilize the preconfigured switch point, but may instead utilize the switch point indicated by the host command.

In one or more implementations, more than two code rates and more than one switch point may be utilized. For example, the controller 130 may transition through utilizing four to eight code rates over the lifetime of the data storage system 100. As each of a sequence of switch points is reached, the controller 130 may progressively switch to utilizing the next higher code rate of the available code rates for the data storage system 100. The host command may indicate multiple switch points for switching between the code rates. For example, if first, second, third, and fourth code rates are available, the host command may indicate three switch points. As such, the code rate may be switched from the first code rate to the second code rate that is higher than the first code rate when a first switch point is reached, may be switched from the second code rate to the third code rate that is higher than the second code rate when a second switch point is reached, and may be switched from the third code rate to the fourth code rate that is higher than the third code rate when a third switch point is reached. The host command may indicate multiple code rates out of a total number of available code rates and multiple switch points for switching between the indicated code rates. For example, if the host command indicates three code rates out of five available code rates and indicates two switch points, the code rate may be switched from a first code rate to a second code rate when a first switch point is reached, and may be switched from the second code rate to a third code rate when a second switch point is reached. Alternatively, the host command may indicate only the next code rate and associated switch point in a sequence of code rates and associated switch points.

The flash memory 150 may include multiple flash memory chips or die, with each chip or die including multiple flash memory blocks. The flash memory chips or die may each have different bit error rate characteristics at different P/E cycle counts over the lifetime of the flash memory 150. In addition, groups of flash memory blocks, or individual flash memory blocks, also may have different bit error rate characteristics at different P/E cycle counts. The controller 130 may utilize different code rates for different parts of the flash memory 150, such as different chips, flash memory blocks, or groups of flash memory blocks. Each part of the flash memory 150 may have its own sequence of code rates and/or switch points, which take into account the different bit error rate characteristics. Alternatively, all of the parts may utilize the same sequence of code rates and switch points and the controller 130 transitions between code rates for each part as each part reaches a switch point. In implementations where different parts of the flash memory 150 may utilize different code rates and/or switch points, the host command may further indicate the part of the flash memory 150 to which the indicated code rate or switch point applies.

Figure 3:
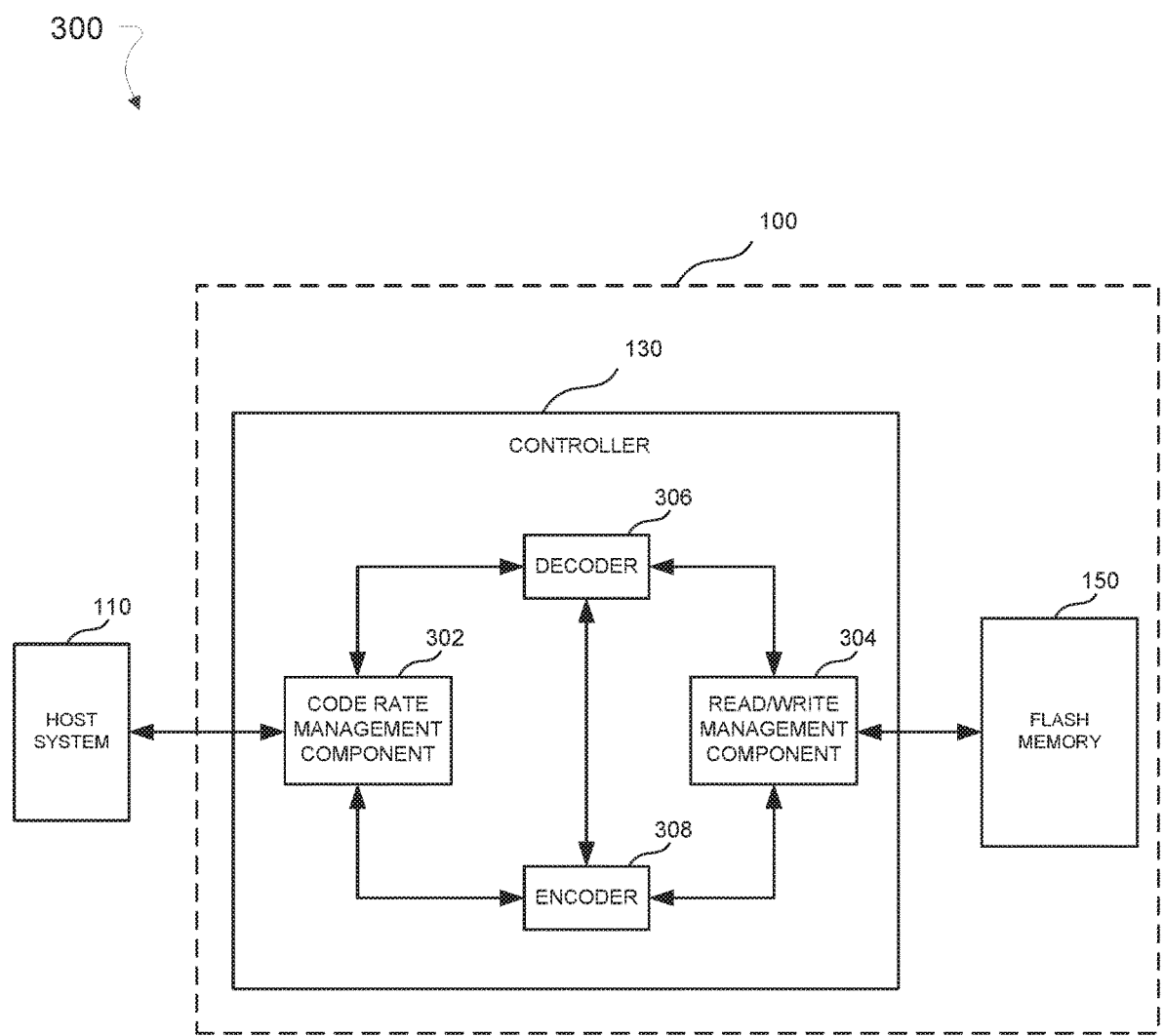
FIG. 3 illustrates example diagram illustrating components included in the controller of the non-volatile flash memory system according to aspects of the subject technology.

FIG. 3 illustrates example diagram 300 illustrating components included in the controller 130 of the non-volatile flash memory system 100 according to aspects of the subject technology. The controller 130 may include a code rate management component 302, a read/write management component 304, a decoder 306, and an encoder 308. One or more of the components included in the controller 130 may communicate with the memory 132 to temporarily store data for various operations by the controller 130. To accommodate different code rates, the encoder 308 and/or the decoder 306 may be configurable to set different code rates. Alternatively, the encoder 308 may include different encoders for different code rates and/or the decoder 306 may include different decoders for different code rates.

The code rate management component 302 may initially set the code rate in the data storage system 100 to a first code rate for encoding data to be written to the flash memory 150. Thus, initially, the encoder 308 may encode data at the first code rate, where the read/write management component 304 may write the data encoded at the first code rate to the flash memory 150. For example, at first, early in the lifecycle, the code rate may be set to the higher code rate because the flash memory 150 may provide sufficient data retention and/or endurance.

The code rate management component 302 may receive a host command indicating a switch point for switching the set code rate from the first code rate to a second code rate. The host system 110 may transmit the host command to the controller 130 such that the code rate management component 302 may receive the host command. The host command may be entered by a user. For example, if the user has knowledge of an expected offline duration of the data storage system 100, the user may be able to set the host command based on the expected offline duration to indicate a switch point that is optimal for the data storage system 100 with the expected offline duration. Therefore, the host command may be sent to the data storage system 100 to customize the switch point based on different situations. When the code rate management component 302 receives the host command, the code rate management component 302 may not utilize the preconfigured switch point because the code rate management component 302 utilizes the switch point indicated by the host command.

The code rate management component 302 may determine whether the indicated switch point has been reached in the flash memory 150. When the code rate management component 302 determines that the indicated switch point has been reached in the flash memory 150, the code rate management component 302 may switch the set code rate from the first code rate to the second code rate at the indicated switch point. The first code rate may be higher than the second code rate, and thus the first code rate may be the higher code rate and the second code rate may be the lower code rate. By switching to the lower rate at the indicated switch point, the code rate management component 302 may be able to reduce errors and compensate for the flash memory 150 wearing out over time.

The switch point may be a P/E cycle threshold. The code rate management component 302 may determine that the indicated switch point has been reached when the code rate management component 302 determines that a P/E cycle count of the flash memory 150 satisfies the P/E cycle threshold. The P/E cycle threshold may be based on an offline duration specification of the data storage system 100.

In one or more implementations, the indicated switch point may be the time at which the host command is received. For example, the host command may indicate that the switch from the first code rate to the second code rate will occur upon receiving the host command. In such a case, the code rate management component 302 may switch the set code rate from the first code rate to the second code rate immediately upon receiving the host command.

When the code rate is switched from the higher rate to the lower rate, it may be beneficial to use the lower code rate to rewrite data written in the flash memory 150, in anticipation of an upcoming offline state of the data storage system 100. For example, before the data storage system 100 becomes offline, it may be beneficial to use the lower code rate to rewrite data written in the flash memory 150 because writing the data at the lower code rate may minimize errors caused from the data storage system 100 being offline. Hence, when the set code rate is switched to the second code rate at the indicated switch point, the read/write management component 304 may read data encoded at the first code rate from the flash memory 150 and the decoder 306 may decode the read data. Subsequently, the encoder 308 may encode the decoded data at the second code rate. Then, the read/write management component 304 may write the data encoded at the second code rate to the flash memory 150. By encoding the data at the second rate that is lower than the first rate and rewriting the encoded data, errors caused by the data storage system 100 being offline may be reduced when the data storage system 100 goes offline.

Figure 4:
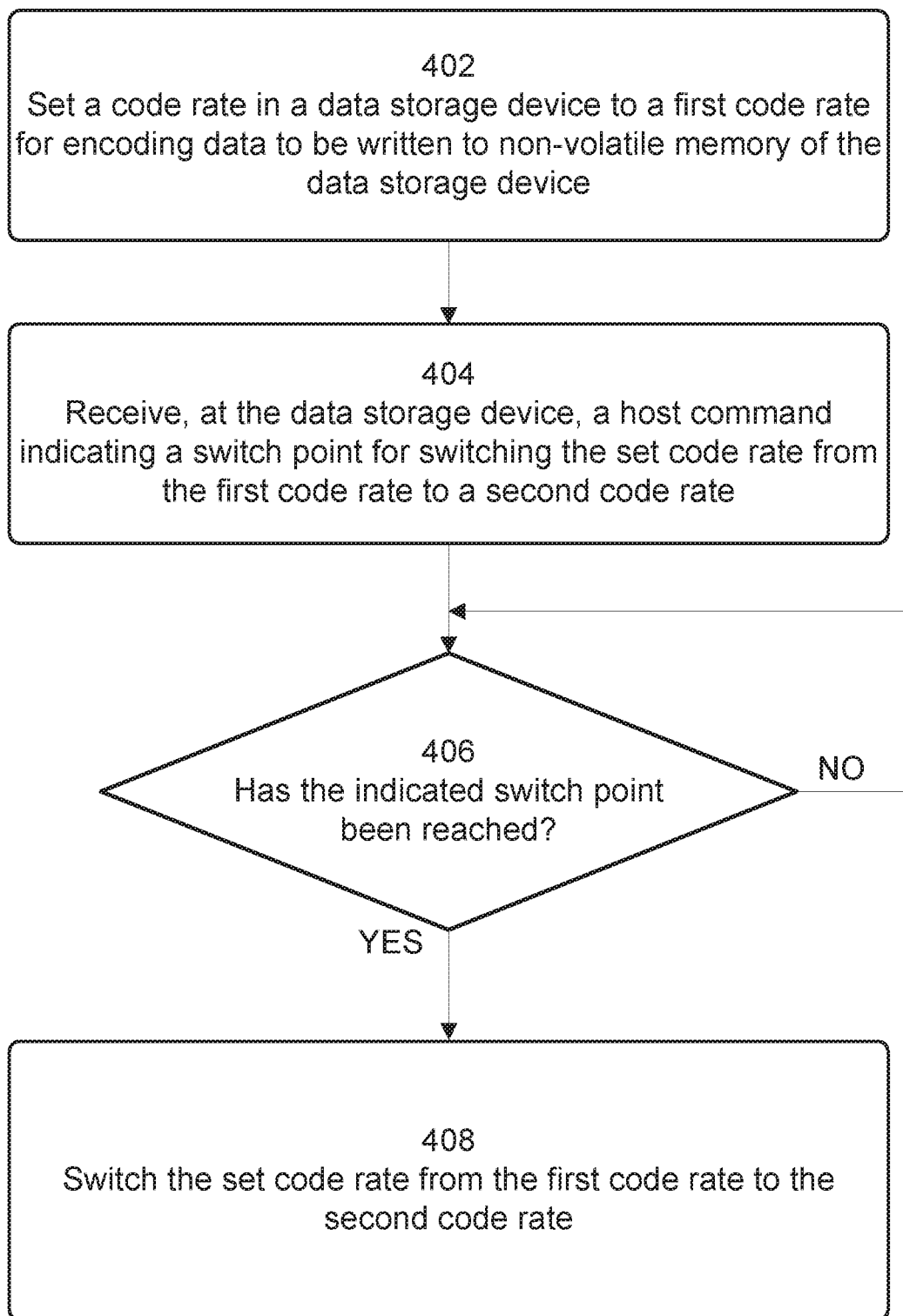
FIG. 4 depicts a flow diagram of an example process for code rate switching for a non-volatile flash memory system according to aspects of the subject technology.

FIG. 4 depicts a flow diagram of an example process 400 for code rate switching for a non-volatile flash memory system according to various aspects of the subject technology. For explanatory purposes, the various blocks of example process 400 are described herein with reference to the components and/or processes described herein. The one or more of the blocks of process 400 may be implemented, for example, by one or more processors, including, for example, controller 130 of FIG. 1 or one or more components or processors of controller 130. In some implementations, one or more of the blocks may be implemented apart from other blocks, and by one or more different processors or controllers. Further for explanatory purposes, the blocks of example process 400 are described as occurring in serial, or linearly. However, multiple blocks of example process 400 may occur in parallel. In addition, the blocks of example process 400 need not be performed in the order shown and/or one or more of the blocks of example process 400 need not be performed. The blocks of process 400, or subset thereof, may also be executed for each memory device and/or to support multiple code lengths, depending on various operating conditions of the memory device(s).

In the depicted example, a system according to the subject technology sets a code rate in a data storage device to a first code rate for encoding data to be written to non-volatile memory of the data storage device (402). At the data storage device (e.g., data storage system 100), a host command indicating a switch point for switching the set code rate from the first code rate to a second code rate is received (404). In some aspects, the first code rate may be higher than the second code rate.

In one or more implementations, the switch point may be the time at which the host command is received. In one or more implementations, the switch point may be a P/E cycle threshold, and it may be determined that the indicated switch point has been reached by determining that a P/E cycle count of the non-volatile flash memory 150 satisfies the P/E cycle threshold. The P/E cycle threshold may be based on an offline duration specification of the data storage device.

The system according to the subject technology determines whether the indicated switch point has been reached in the flash memory 150 (406). If it is determined that the indicated switch point has been reached in the flash memory 150, the set code rate is switched from the first code rate to the second code rate (408). If it is determined that the indicated switch point has not been reached in the flash memory 150, the set code rate may remain at the first code rate.

Figure 5:
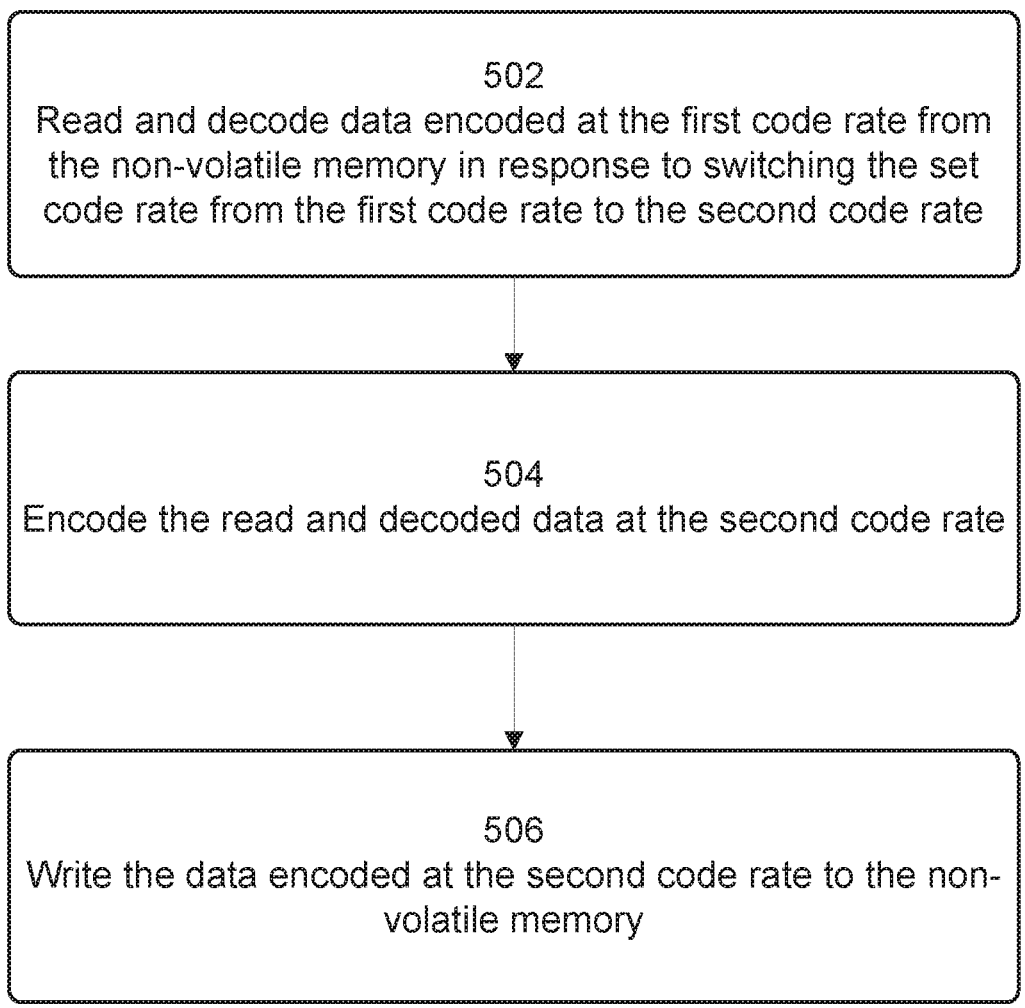
FIG. 5 depicts a flow diagram of an example process for code rate switching for a non-volatile flash memory system according to aspects of the subject technology.

FIG. 5 depicts a flow diagram of an example process 500 for code rate switching for a non-volatile flash memory system according to various aspects of the subject technology. For explanatory purposes, the various blocks of example process 500 are described herein with reference to the components and/or processes described herein. The one or more of the blocks of process 500 may be implemented, for example, by one or more processors, including, for example, controller 130 of FIG. 1 or one or more components or processors of controller 130. In some implementations, one or more of the blocks may be implemented apart from other blocks, and by one or more different processors or controllers. Further for explanatory purposes, the blocks of example process 500 are described as occurring in serial, or linearly. However, multiple blocks of example process 500 may occur in parallel. In addition, the blocks of example process 500 need not be performed in the order shown and/or one or more of the blocks of example process 500 need not be performed. The blocks of process 500, or subset thereof, may also be executed for each memory device and/or to support multiple code lengths, depending on various operating conditions of the memory device(s).

The example process 500 may take place when the set code rate is switched from the first code rate to the second code rate. In the depicted example, the system according to the subject technology reads and decodes data encoded at the first code rate from the non-volatile memory in response to switching the set code rate from the first code rate to the second code rate (502). The read and decoded data is encoded at the second rate (504). The data encoded is written at the second rate to the non-volatile memory (506).

The above steps of processes 400 and 500 may be performed by controller 130, utilizing the code rate management component 302, the read/write management component 304, the decoder 306, and the encoder 308. Many of the above-described features of example processes 400 and 500 and related features and applications, may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

The systems and methods disclosed herein may be applied to hard disk drives, hybrid hard drives, and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific example implementations disclosed above may be combined in different ways to form additional example implementations, all of which fall within the scope of the present disclosure. Although the present disclosure provides certain preferred example implementations and applications, other example implementations that are apparent to those of ordinary skill in the art, including example implementations which do not provide all of the features and advantages set forth herein, are also within the scope of this disclosure. Accordingly, the scope of the present disclosure is intended to be defined only by reference to the appended claims.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A data storage system, comprising:
   one or more memories; and
   one or more controllers configured to cause:
      obtaining a command indicating a switch point for switching a code rate from a first code rate to a second code rate that is different from the first code rate, wherein the code rate is for encoding data to be written to the one or more memories, and wherein the switch point corresponds to an operational threshold for the one or more memories;
      setting a first switch point of the data storage system to the switch point;
      switching the code rate from the first code rate to the second code rate, responsive to the switch point occurring;
      after the switching, encoding the data at the second code rate; and
      writing the data encoded at the second code rate to the one or more memories.

2. The data storage system of claim 1,
   wherein obtaining the command comprises receiving the command from a system different from the data storage system,
   wherein the first switch point is a pre-determined switch point, and
   wherein the switch point is different from the pre-determined switch point.

3. The data storage system of claim 1,
   wherein the first code rate comprises a first ratio of parity data for encoding data to be written to the one or more memories,
   wherein the second code rate comprises a second ratio of parity data for encoding data to be written to the one or more memories, and
   wherein the second ratio is different from the first ratio.

4. The data storage system of claim 3, wherein the second ratio is greater than the first ratio responsive to the second code rate being less than the first code rate.

5. The data storage system of claim 1, wherein the operational threshold for the one or more memories comprises a lifecycle threshold of the one or more memories.

6. The data storage system of claim 1, wherein the switch point is time at which the switch point is received from a host.

7. The data storage system of claim 1, wherein the one or more controllers are further configured to cause:
   after the switching of the code rate but prior to the encoding of the data at the second code rate, reading and decoding the data encoded at the first code rate from the one or more memories.

8. The data storage system of claim 1,
   wherein the switch point is a program-erase cycle threshold,
   wherein the one or more controllers are further configured to cause:
      determining that a program-erase cycle count of the one or more memories satisfies the program-erase cycle threshold,
   wherein the switching of the code rate from the first code rate to the second code rate occurs in response to the determining.

9. The data storage system of claim 8, wherein the program-erase cycle threshold is based on an offline duration specification of the data storage system.

10. A method, comprising:
   obtaining a command indicating a switch point for switching a code rate from a first code rate to a second code rate that is different from the first code rate, wherein the code rate is for encoding data to be written to one or more memories, and wherein the switch point corresponds to an operational threshold for the one or more memories;
   setting a first switch point of a data storage system to the switch point;
   switching the code rate from the first code rate to the second code rate, responsive to the switch point occurring;
   after the switching, encoding the data at the second code rate; and
   writing the data encoded at the second code rate to the one or more memories.

11. The method of claim 10,
   wherein obtaining the command comprises receiving the command from a system different from the data storage system,
   wherein the first switch point is a pre-determined switch point, and
   wherein the switch point is different from the pre-determined switch point.

12. The method of claim 10,
   wherein the first code rate comprises a first ratio of parity data for encoding data to be written to the one or more memories,
   wherein the second code rate comprises a second ratio of parity data for encoding data to be written to the one or more memories, and
   wherein the second ratio is different from the first ratio.

13. The method of claim 12, wherein the second ratio is greater than the first ratio responsive to the second code rate i-s-being less than the first code rate.

14. The method of claim 10, wherein the operational threshold for the one or more memories comprises a lifecycle threshold of the one or more memories.

15. The method of claim 10, further comprising:
   after the switching of the code rate but prior to the encoding of the data at the second code rate, reading and decoding the data encoded at the first code rate from the one or more memories.

16. An apparatus, comprising:
   means for obtaining a command indicating a switch point for switching a code rate from a first code rate to a second code rate that is different from the first code rate, wherein the code rate is for encoding data to be written to one or more memories, and wherein the switch point corresponds to an operational threshold for the one or more memories;
   means for setting a first switch point of the apparatus to the switch point;
   means for switching the code rate from the first code rate to the second code rate, responsive to the switch point occurring;
   after the switching, means for encoding the data at the second code rate; and
   means for writing the data encoded at the second code rate to the one or more memories.

17. The apparatus of claim 16,
   wherein the means for obtaining the command comprises means for receiving the command from a system different from the apparatus,
   wherein the first switch point is a pre-determined switch point, and
   wherein the switch point is different from the pre-determined switch point.

18. The apparatus of claim 16,
   wherein the first code rate comprises a first ratio of parity data for encoding data to be written to the one or more memories,
   wherein the second code rate comprises a second ratio of parity data for encoding data to be written to the one or more memories, and
   wherein the second ratio is different from the first ratio.

19. The apparatus of claim 18, wherein the second ratio is greater than the first ratio responsive to the second code rate being less than the first code rate.

20. The apparatus of claim 16, further comprising:
   means for determining that the switch point is reached in the one or more memories,
   wherein the means for switching comprises means for switching the code rate from the first code rate to the second code rate in response to determining that the switch point is reached.

* * * * *